(12) United States Patent
Li et al.

(10) Patent No.: US 8,745,571 B2
(45) Date of Patent: Jun. 3, 2014

(54) ANALYSIS OF COMPENSATED LAYOUT SHAPES

(75) Inventors: Hongmei Li, Williston, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 13/026,451

(22) Filed: Feb. 14, 2011

(65) Prior Publication Data
US 2012/0210283 A1 Aug. 16, 2012

(51) Int. Cl.
G06F 15/04 (2006.01)

(52) U.S. Cl.
USPC ............. 716/139; 716/126; 716/132; 703/14

(58) Field of Classification Search
USPC .......................................... 716/126, 132, 139
See application file for complete search history.

(56) References Cited

U.S. PATENT DOCUMENTS

| | | | |
|---|---|---|---|
| 4,448,083 A | 5/1984 | Hayashi | |
| 6,209,123 B1 * | 3/2001 | Maziasz et al. | 716/123 |
| 7,302,673 B2 | 11/2007 | Habitz et al. | |
| 7,337,420 B2 * | 2/2008 | Chidambarrao et al. | 716/112 |
| 7,707,899 B2 | 5/2010 | Sakurai et al. | |
| 8,245,131 B2 * | 8/2012 | Chao et al. | 715/243 |
| 8,453,100 B2 * | 5/2013 | Chidambarrao et al. | 716/136 |
| 2005/0040460 A1 | 2/2005 | Chidambarrao et al. | |
| 2008/0216041 A1 | 9/2008 | Wangxiao et al. | |
| 2009/0108839 A1 | 4/2009 | Ausserlechner | |
| 2009/0113358 A1 | 4/2009 | Goodnow et al. | |
| 2010/0042958 A1 | 2/2010 | Moroz et al. | |

FOREIGN PATENT DOCUMENTS

| | | |
|---|---|---|
| JP | 54045573 A | 4/1979 |
| JP | 1321640 A | 12/1989 |
| JP | 201033278 A | 2/2010 |

OTHER PUBLICATIONS

IBM Technical Disclosure Bulletin, "Relating Logic Design to Physical Geometry in LSI Chip", Lallier et al., Nov. 1976, pp. 2140-2143.

* cited by examiner

*Primary Examiner* — Thuan Do
(74) *Attorney, Agent, or Firm* — Anthony J. Canale; Hoffman Warnick LLC

(57) ABSTRACT

The disclosure relates to the analysis of compensated layout shapes. A method in accordance with an embodiment includes: analyzing a semiconductor layout using a bucket structure, the layout including a semiconductor device; and applying a pattern template to a content of the bucket structure to identify a shape adjacent to the semiconductor device; wherein the pattern template is derived from layout groundrules.

12 Claims, 17 Drawing Sheets

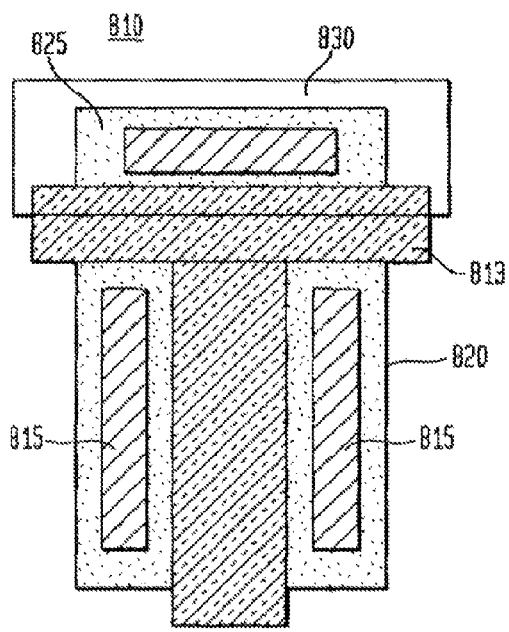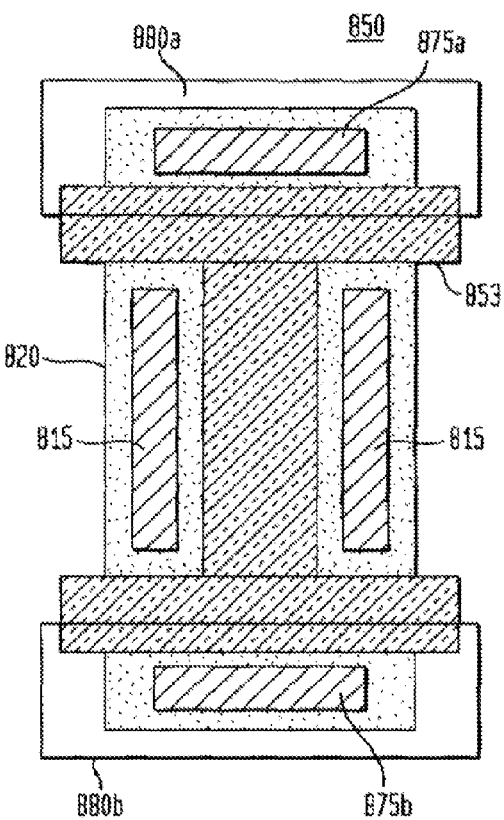

ANALYSIS OF COMPENSATED LAYOUT SHAPES

BACKGROUND

The disclosure relates generally to semiconductor devices. More particularly, the disclosure relates to the analysis of compensated layout shapes.

Stress can be applied in semiconductor devices to increase the mobility of electrons or holes in such devices. For example, stress can be applied to a channel of a field effect transistor (FET) by using intrinsically stressed films, such as a liner film that is often used in the formation of metal contact (MC) terminals to the source and drain regions of the FET. Stress films generally comprise materials (e.g., nitrides) that are compatible with the silicon fabrication process steps used for contact formation and etching. Liner films exert stress on an isolated FET gate (also called the "victim" gate) by adhering to adjacent surfaces, such as the wafer surface, and "pushing" or "pulling" on the gate structures. The stress can be transferred through the gate spacers, which are self-aligned to the gate polysilicon (PC). A liner film with inherent tensile stress transfers tensile stress, and is used for improving electron mobility in n-type FETs (NFETS), while a liner film with inherent compressive stress transfers compressive stress, and is used for improving hole mobility in p-type FETs (PFETs).

One factor that dilutes the effectiveness of nitride liners is that the contact metallurgy, particularly to the source and drain regions, requires parts of the liner to be etched away very near the device. This not only disrupts the transfer of stress, but also moves the singularity/edge that would influence the channel further away, severely reducing the stress benefit. Other structures that are on the same physical level above the silicon surface such as contact metallurgy and that interrupt the film planarity can also have the same effect. An example of such a structure is polysilicon wiring. Further, an even more serious concern is that these structures can be arbitrarily designed and therefore have a difficult to predict effect on performance, either positive or negative. Layout-dependent factors that influence the stress include the spacing between the victim gate and adjacent structures, the dimensions of these adjacent structures, the amount of contact coverage (or source/drain strapping), and in the case of dual-stress liner technologies (one liner for NFETS and a different liner for PFETS), the proximity of the interface between the two liner films. Small changes in FET layout can introduce noticeable shifts in drive current, and this variation can appear to change from device to device across a chip. Not accounting for this magnitude of variation in stress benefit can seriously underpredict or overpredict electrical performance in circuit simulation. Furthermore, with information about the influence of stress on a given layout, circuit designers can optimize their designs for exploiting stress.

Previously developed layout-sensitive effects that have been studied include shallow trench isolation (STI) stress effects and N-Well scattering effects. The STI stress effect is accounted for by obtaining the dimensions of the active area (silicon island surrounded by STI) of the semiconductor device and adjusting the mobility as a function of dimensional parameters. A primary cause of stress in an STI process is that a compressive stress is applied in both longitudinal (orthogonal to the gate) and transverse (parallel to the gate) directions, altering the silicon band structure locally. Such a stress degrades the NFETs while benefiting the PFET. The stress-based adjustment is then based purely on empirical data from a set of specifically designed macros that span the complete active area design space. Then for any given active area length/width, one can interpolate the results. Moreover, parametric fits to the mobility impact can be experimentally obtained from experimental data.

The N-well scattering effect occurs when implant shadowing of dopant ions scatters to unintended locations from relatively thick resist layers. N-well implant scattering is therefore also layout sensitive, but this sensitivity is unrelated to stress effects. That is, the influence of N-well implant scattering alters the voltage threshold (Vt) of devices that happen to be close by.

This impact causes circuit operability problems and therefore must be properly modeled. The modeling methodology is to identify the N-well resist proximity based on plan view layout and defining, again through empirical calibration, and based on distances from the N-well resist edges, the threshold voltage impact of the N-well scattering.

SUMMARY

The disclosure relates to the analysis of compensated layout shapes.

A first aspect of the disclosure provides a method for layout analysis, comprising: analyzing a semiconductor layout using a bucket structure, the layout including a semiconductor device; and applying a pattern template to a content of the bucket structure to identify a shape adjacent to the semiconductor device; wherein the pattern template is derived from layout groundrules.

A second aspect of the disclosure provides a system for layout analysis, comprising: using at least one computing device for performing a method, the method comprising: analyzing a semiconductor layout using a bucket structure, the layout including a semiconductor device; and applying a pattern template to a content of the bucket structure to identify a shape adjacent to the semiconductor device; wherein the pattern template is derived from layout groundrules A third aspect of the disclosure provides a computer program comprising program code embodied in at least one computer readable storage medium, which when executed, enables a computer system to implement a method for layout analysis, the method comprising: analyzing a semiconductor layout using a bucket structure, the layout including a semiconductor device; and applying a pattern template to a content of the bucket structure to identify a shape adjacent to the semiconductor device; wherein the pattern template is derived from layout groundrules. The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 8A and 8B illustrate examples of the more complex FET arrangements capable of being analyzed according to an embodiment.

Figure 1:
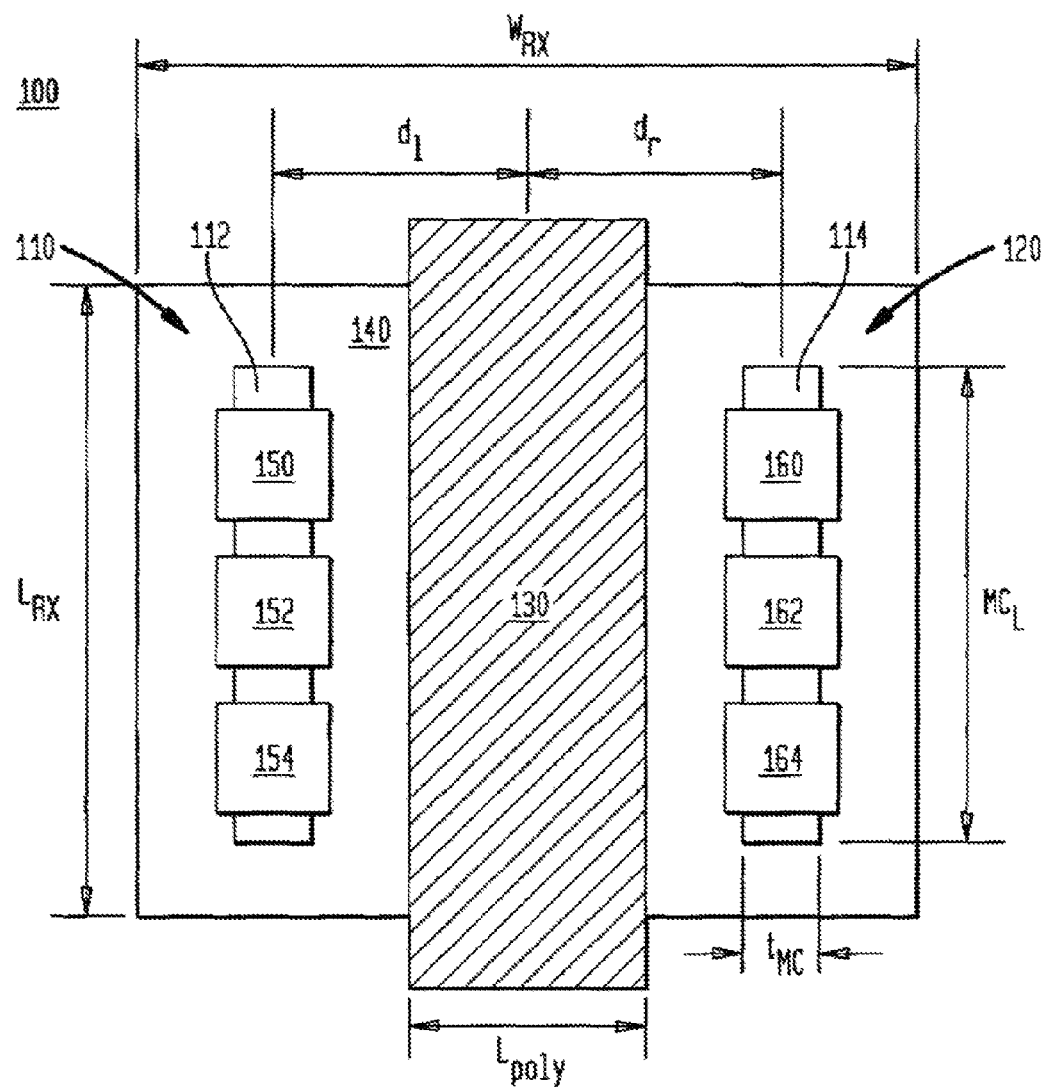
FIG. 1 illustrates an example of a semiconductor device that uses metal contact (MC) strapping.

It is noted that the drawings of the disclosure are schematical in nature and not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure relates to the analysis of compensated layout shapes.

Current large-scale integration technologies (e.g., ultra-large-scale integration (ULSI) technologies) often use a mask engineering process called "mask comps" (compensation of layout shape dimensions) to locally adjust FET channel length to control Ioff and Ieff in different threshold families on the same wafer. Mask comps can result in FET gates on a wafer with different channel lengths that are adjacent to each other.

A first portion of the disclosure describes a method for analyzing the stress response of large-scale integration technologies that do not utilize comps. Although this method can, to some degree, also treat layouts that include comps, there are some layout configurations that are less accurately treated than is desirable. A detailed description of this method can be found in U.S. Pat. No. 7,337,420, which is incorporated herein in its entirety by reference. A second portion of the disclosure describes a method for accurately analyzing the stress response of layout configurations that include comps.

The present disclosure extends previously developed layout-sensitive compact model algorithms for other phenomena to accurately account for effects of layout-induced changes due to, for example, liner film stress in semiconductor devices. In particular, the invention accounts for the impact of large layout variation on circuits with algorithms for obtaining the correct stress response approximations and layout extraction algorithms to obtain the correct geometric parameters that drive the stress response. Particularly, these algorithms include specific information in search "buckets" that are directionally-oriented and include directionally-specific distance measurements for analyzing in detail the specific shape neighborhood of the semiconductor device.

Analytical Model and Algorithm

It is problematic to interpolate experimentally-based results for all possible liner case layouts because the layout variations are numerous and typical layout rules are either too complex or too general to predict this variation. Therefore, the experimental data cannot encompass all possible variations, and there will be many situations where extrapolation well beyond the data range with a predictive methodology is needed. The requirements for modeling the layout dependence of the previously mentioned STI stress effect are more straightforward because the design space consists of only the two $L_{RX}$ and $W_{RX}$ parameters. However, in the liner MC etch layout effect, there are many layout dependent parameters such as MC distance, the amount of MC strapping, the number of MC pieces, and the number of parallel MCs. Here, "MC" and "MCBAR" refer to the local interconnect mask forming the metal connections and "PC" refers to the name of the mask used to make the polysilicon gate. Further, these changes should be characterized out to a relatively large distance from the actual device across its entire width. Moreover, within a very short longitudinal distance, many nitride liner "cuts" can impact the stress may be present.

FIG. 1 shows an example of a semiconductor device, e.g., a FET, suitable for characterizing metal contact (MC) strapping. The device 100 includes a source region 110 and a drain region 120 separated by a polysilicon gate 130. Metal contacts 112 and 114 having a length $MC_L$ and a width $t_{MC}$ are provided at a distance $d_l$ and $d_r$ from a reference line at the middle of gate 130 on each side of the gate 130 in the source and drain regions 110 and 120, respectively. The rectangular active area ($A_{RX}$) 140 of the device 100 is given by $L_{RX} \times W_{RX}$. Additional contacts 150, 152 and 154 are provided for the source 110, while additional contacts 160, 162 and 164 are provided for the drain 120.

The stress function, or response, for such a semiconductor device is complex, three-dimensional, and is sensitive to the amount of MC strapping. Ideally, circuit simulation with layout-dependent stress effects on FET would incorporate TCAD (Technology Computer-Aided Design) simulation. However, one cannot perform a full 3D calculation of stresses for each layout variation because of the high cost in CPU time. With layout variations in the thousands and each individual 3D finite element model (FEM) stress calculation taking hours of CPU runtime, and neglecting the difficulty of setting up the structure up in these 3D FEM codes, the problem is intractable. Even performing 2D calculations linked to the circuit simulators is not possible. The invention addresses these issues by providing an algorithm to approximate all of these complex 3D sets of problems into one analytical model.

Analytical Model

It is a goal of the analytical model is to reduce the complex 3D geometry of the victim gate and the surrounding structures to a "single valued" stress value representing an "average" stress for each device. Then the impact on the device mobility and other important metrics can be evaluated.

Figure 2:
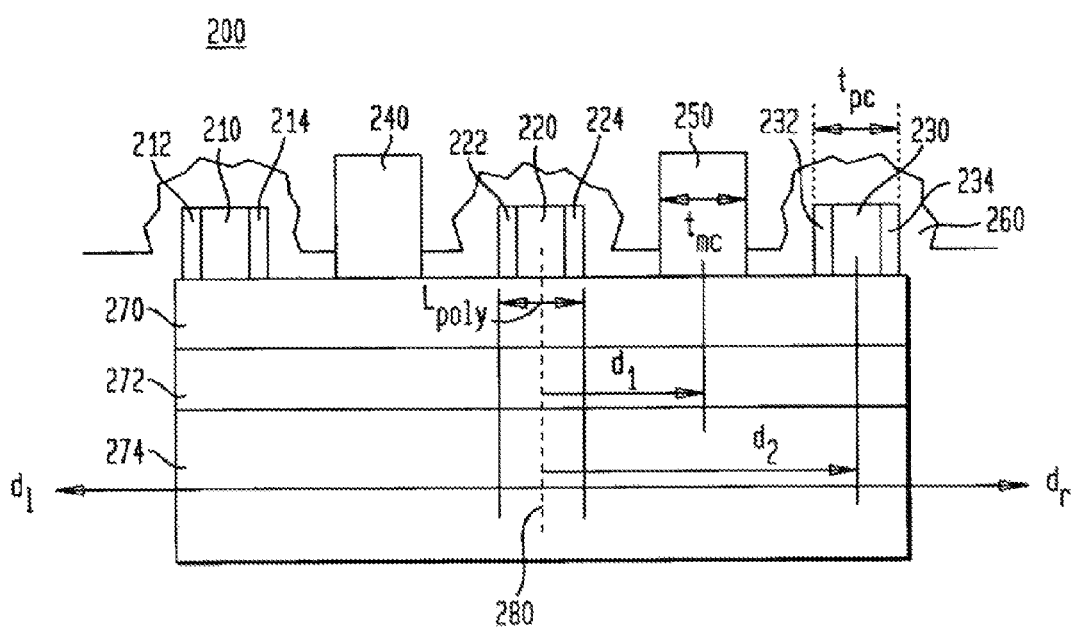
FIG. 2 illustrates a first model, through a cross-sectional view, of a semiconductor device according to an embodiment.

FIG. 2 illustrates a model of an illustrative semiconductor device. A cross-sectional view of a semiconductor device 200 analogous to that shown in FIG. 1 is provided. The device 200 includes a number of polysilicon gates 210, 220 and 230 with spacers. Specifically, spacers 212 and 214 are provided for gate 210, spacers 222 and 224 are provided for gate 220, and spacers 232 and 234 are provided for gate 230. The length of the gate (PC) is denoted as 401. Metallic contacts (MC) 240 and 250 are provided between the gates, e.g., for contacting drain/source diffusion regions. The width of the MC (contact) is denoted as $t_{mc}$. Note that additional gates and contacts may be provided as well extending rightward and/or leftward in the device 200. A nitride liner 260 is a film that is provided over the entire surface of the device 200. The device 200 also includes a number of different substrate and/or isolation layers 270, 272 and 274. From a reference line 280 at the center of the gate 220, $d_r$ denotes a distance rightward and $d_l$ denotes a distance leftward. Specifically, "$d_1$" and "$d_2$", respectively, denote distances from the reference line 280 to the respective reference lines at the center of the MC contact 250, and, the center of the gate 230, and the right hand side of the contact 250. It should be understood, that alternatively, the reference line 280 may be located at the right hand side of the gate 220 rather than at the center of the gate as shown in FIG. 2. Thus, using that reference line in that model "$d_1$" may denote a distance from that reference line 280 to the left side of the contact 250, and, "$d_2$" may denote a distance from the reference line 280 to the right side of the contact 250.

From the model shown in FIG. 2, for calculating the "single valued" stress value, variables are needed for implementation within an extraction tool that is used to obtain information such as interconnect resistance and capacitance based on layout design data. The variables include, for example: (a) the distances $d_r$, $d_l$ between the victim gate and adjacent PC or MC; (b) the adjacent MC or PC width $t_{MC}$ or $t_{PC}$; and, (c) the adjacent MC or PC lengths $MC_L$ or $PC_L$. It is understood that other distance reference schemes may be used. For example, the distances could be measured in edge-to-edge values instead of center-to-center distances.

Algorithm

The details of the analytical model and the extraction algorithm are now described in greater detail hereinbelow. A generalized flow chart and the relevant equations are referenced for (a) the extraction, (b) the stress calculator, and (c) the device impact through mobility.

According to the disclosure, a bucket approach is used with a large number of buckets, with each bucket size limited to the minimum MC size, for example. A "bucket" refers to a two-dimensional search region between the gate and other adjacent shapes. Any shape or portion of a shape that is found in a bucket is represented by the number of vertices in the shape, the total area of the shape, and the perimeter of the shape. Overall this provides a compact and uniform method for describing the shapes in the neighborhood of the gate. By analyzing multiple adjacent buckets, the location and size of adjacent shapes can be determined. It is understood that the N-well scattering impact analysis may also utilize the bucket approach; however, the information extracted is limited and the impact focuses only on Vt change.

For the stress calculations performed in accordance with the disclosure, the method: (a) seeks many different parameters such as gate orientation, MC and PC location, area, perimeter, in each bucket, (b) uses equations to extract distances from area and perimeter components, (c) links real and perimeter components across buckets, (d) feeds results into an analytical stress calculation, (e) obtains effects on mobility, currents, and other model quantities, (f) obtains BP/BN edge effects which are included through other parameter extraction and stress calculations, where BP and BN are two complementary masks that define the presence of the two different liner films used in semiconductor device technology, and (g) sums all of the various stress effects appropriately.

Figure 3A:
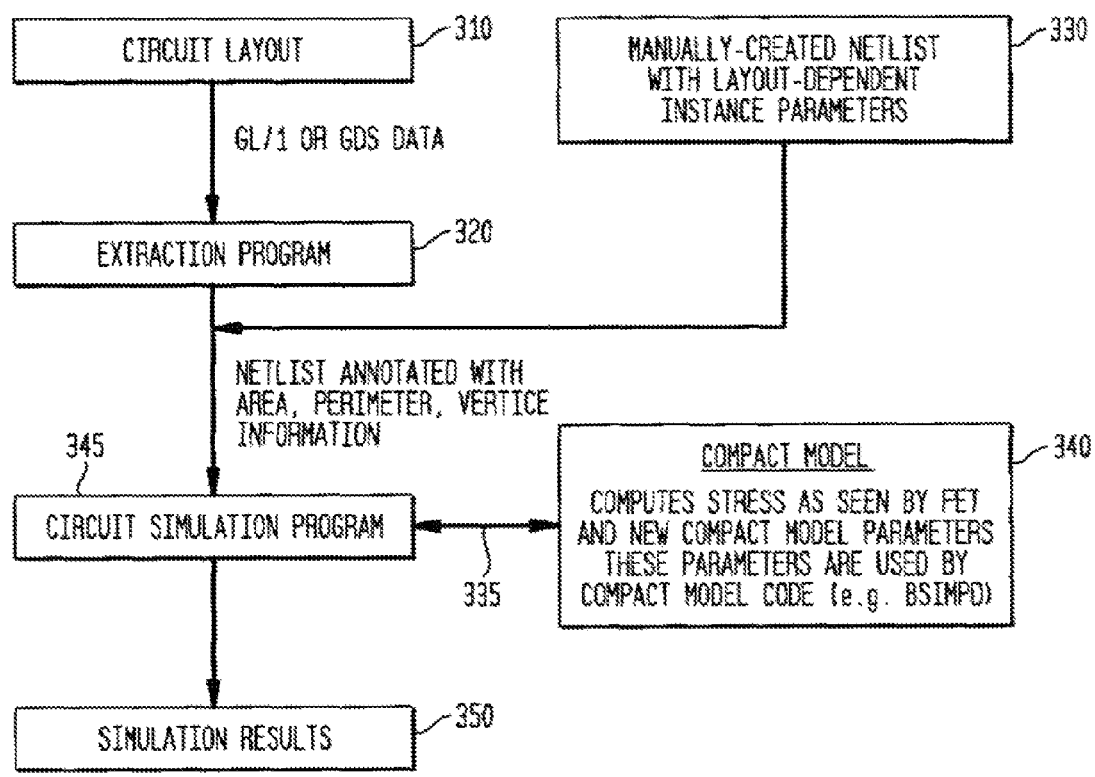
FIGS. 3A and 3B illustrate alternate embodiments for calculating the impact of transistor device stress according to an embodiment.

FIG. 3A illustrates a layout extraction algorithm according to an embodiment. At block 310, circuit layout data is provided, e.g., in a GL1 or GDSII format. GL1 (Graphics Language 1, developed by IBM Corporation) and GDSII (Graphic Data System version 2, developed by GE CALMA) refer to graphics languages that provide a standard file format for transferring and archiving 2D graphical design data. At block 320, according to a first phase of the algorithm, an extraction program is executed to provide a netlist annotated with stress parameters used in the invention including: areas, perimeters, distances and shape vertices. One example extraction program is the Efficient Rapid Integrated Extraction (ERIE) parasitic model extraction tool from IBM Corporation, that typically provides circuit-level netlists from layout design data, and extracts interconnect resistance and capacitance. Thus, in the first phase of the algorithm, the extraction tool provides layout-dependent information including non-specific shape information.

Referring to FIG. 3A at block 340, according to a second phase of the algorithm, a compact model that is augmented with the stress model algorithms is executed that computes stress as seen by the channel, and according to a third phase of the algorithm, additionally computes effects on device carrier mobilities. The compact model 340 may be a standard BSIM model that is compatible with a circuit simulator such as PowerSPICE, developed by IBM Corporation. BSIM or more specifically, "BSIMPD" refers to compact model code for Silicon-on-insulator (SOI) devices that is publicly available from the University of California, Berkeley. "PD" denotes "partially-depleted", but note that the subject matter disclosed herein is not limited to a specific compact model type.

Thus, according to the second phase of the algorithm, the annotated netlist interface comprising layout-dependent information including non-specific shape information obtained from the extraction tool is converted into specific shape information.

It should be understood that, in one embodiment, the annotated netlist interface information provided by the extraction program may first be compressed into a standard format (an "interface") and that compressed layout description is passed to the compact model. This may be needed due to limitations in the way information is passed between the two programs (extractor and compact model). Alternatively, the layout information may be passed from the extraction program to the compact model without requirement of compression. For example, if there was a software environment in which these two codes were tightly coupled, the extractor could directly pass all of the shape information verbatim to the compact model. One implementation for this method of passing data is a simple linked list of shape coordinates. It is further possible that the conceptual reverse situation is used, meaning that instead of highly-detailed information being passed, less information is passed. This is possible in the case where the semiconductor process (or layout design system) only supports a fixed set of transistor or electrical element layouts, a simplification that is advantageous in some cases. Thus, for example, there may be only 4 transistor layouts or 3 resistor types supported. In that case, the extractor will indicate that a particular transistor design is according to a first layout (e.g., "layout style 1") and the compact model, which knows the stress or layout for layout style 1, immediately knows what stress/modified model parameters to provide.

More particularly, according to the second phase of the algorithm, there is initiated a scanning of the contents of adjacent search buckets on either side of a "victim" gate. By considering restrictions such as physical layout rules, which buckets contain shapes, and the area/perimeter/vertices, the information about the number of shapes and their physical width and length, where width is stored as the location of starting/ending edges of the shapes and length (i.e., "run-length") is defined to be parallel to the edge of the victim gate. The result of the second phase is a list of layout information concerning adjacent shapes on levels such as MC, PC, and liner stress film interfaces (BP/BN interface). It is understood that the algorithm includes a "self" stress term that represents the transistor in isolation, with no nearby layout features that would degrade the stress keeping in mind that reduced stress is considered to be undesirable since high stress of the proper type tends to increase mobility. Using the information in the search buckets, adjacent shapes are analyzed and, as appropriate, the reduction in stress is computed for each adjacent shape. This is done for both left and right sides of the transistor using the PC gate shape as a center reference, and is done for both MC and adjacent PC shapes. BP/BN interface effects are also included.

With the channel stress known, the third phase of the algorithm implements the compact model code which translates the stress into compact model parameters 335 which are utilized by the full compact model equations (such as the previously mentioned BSIM model) and by the circuit simulation program 345 for circuit simulation. This part of the algorithm considers both longitudinal stress (along the direction of current flow in an FET) and transverse stress (parallel to the victim gate). Analytic expressions are used to make this conversion. The modified parameters 335 can include terms such as FET mobility. The compact model parameters are then passed to the compact model code such as the above-referenced BSIM model.

As further shown in FIG. 3A, the circuit simulation program 345 may also receive manually-created netlist input as shown at block 330. Generally, compact models for circuit simulation are CAD tools for circuit design that play an important role in designing nanometer scale systems-on-chip (SOC). In particular, a compact model plays a key role in the accuracy and efficiency of the circuit simulator used by designers, as well as a bridge to the technology in which the design is to be fabricated. Compact models for circuit simulation element such as field-effect transistors include effects such as geometry, bias, temperature, DC, AC, RF, and noise characteristics.

Finally, as shown in FIG. 3A, the circuit simulation program 345 is executed utilizing the new compact model parameters 335 to analyze the electrical performance of various circuit topologies, and simulation results 350 are generated.

Figure 3B:
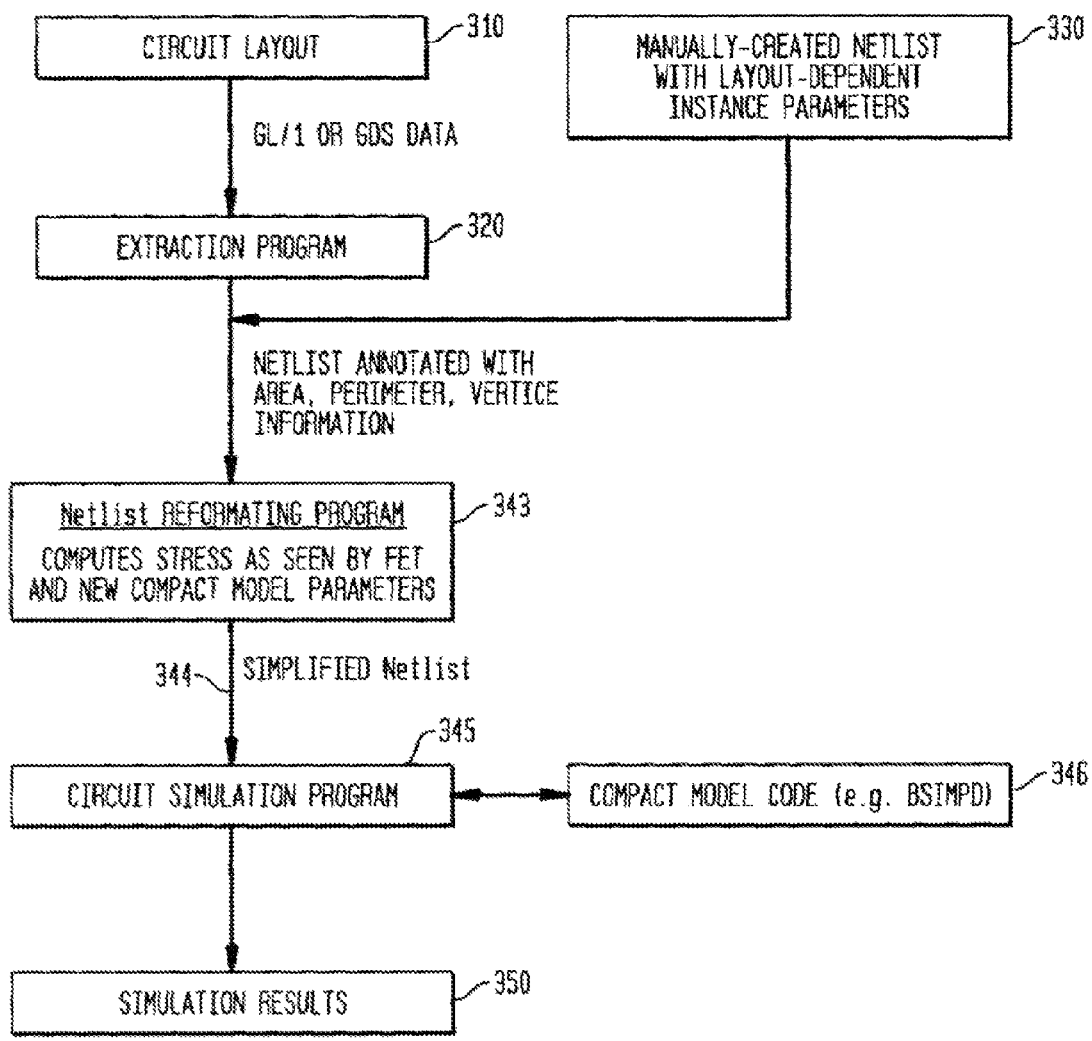

FIG. 3B illustrates an alternative embodiment of a layout extraction algorithm. In the embodiment depicted in FIG. 3B, it is noted that while the stress model algorithm may be invoked as part of the compact models that are used in circuit simulation, it can also be incorporated in a software application 343 that functions independently of the compact model 346 (with no stress model algorithm) and the circuit simulator 345 for the purpose of simplifying extracted netlists that include stress model instance parameters. In this latter application, an extracted netlist with all layout-dependent stress parameters included is input to the program 343 that calls the stress model algorithm. The stress model algorithm then computes modified FET model parameters (such as mobility) that are needed during circuit simulation and generates a reduced netlist 344 that includes modified FET model parameters instead of the original full set of layout-dependent parameters. The program 343 for netlist reduction could be a separate program, part of the extraction program, or part of the circuit simulator (but not the compact model).

Figure 4A:
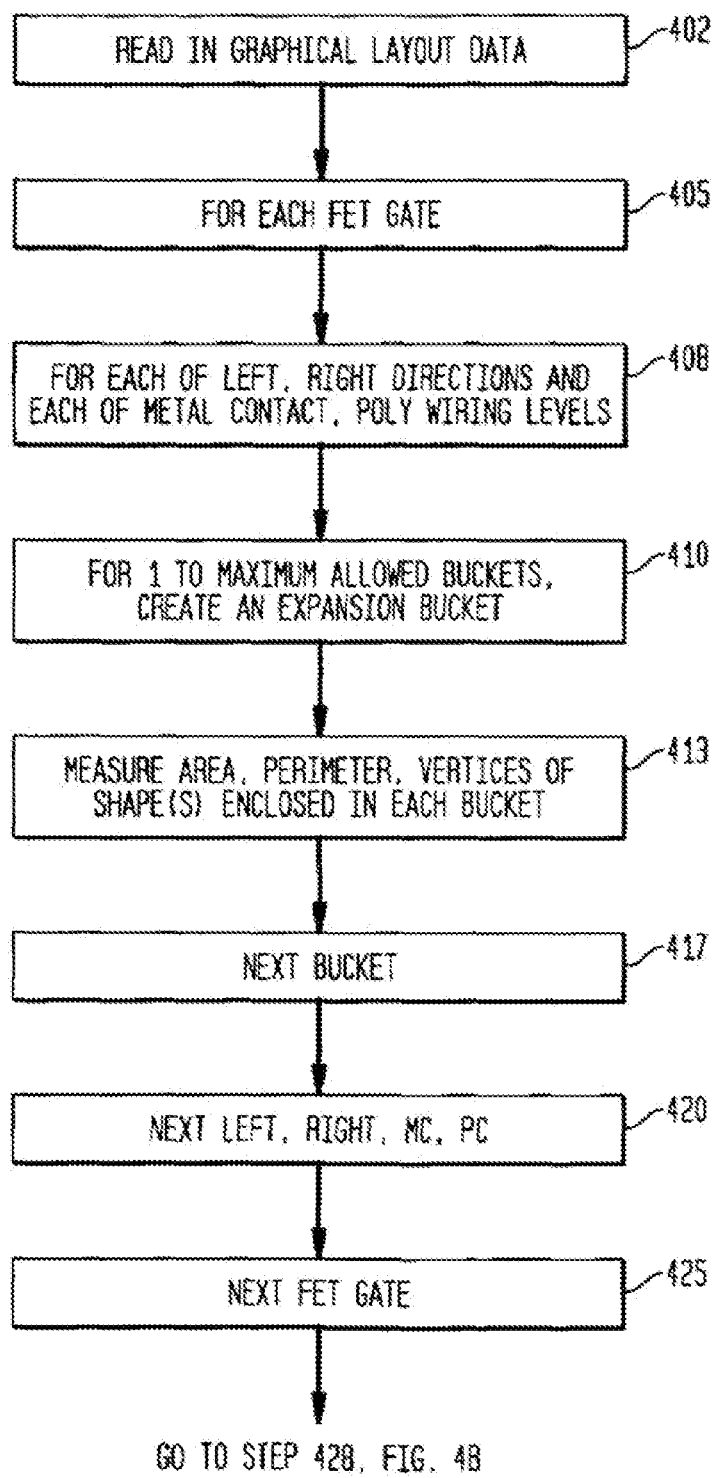
FIGS. 4A and 4B illustrate the methodology implemented by the netlist extraction program shown in FIG. 3A according to an embodiment.

FIG. 4A illustrates an illustrative methodology 400 implemented by the netlist extraction program 320 shown in FIG. 3A. As shown in FIG. 4A, step 402 is the step of inputting the 2D graphical layout data for the circuit. While the disclosure is generally applicable for modeling performance of all types of circuits and semiconductor devices using the "bucket" approach described herein, for exemplary purposes, the novel process is described with respect to extracting stress parameters from the layout of FET devices. In extracting stress parameters from the layout, a plurality of types of extraction can be used. For example, gate PC to adjacent PC (PC-PC), gate PC to adjacent MC (PC-MC) extraction (local nearest neighbors analysis using buckets), and BP/BN edge extraction (local/distant shape edge measurement) may be used. PC-PC and PC-MC are performed using buckets, while BP/BN is performed using a distance measurement.

Thus, as shown in FIG. 4A, the following is iteratively performed: for each FET gate 405 included in the circuit, and, for each of left, right directions and each of metal contact (MC), poly wiring levels (PC), shown at a step 408, and for each bucket up to a predetermined maximum allowed, an expansion bucket is generated as indicated at step 410. The bucket approach is now described in greater detail herein with respect to FIG. 5.

Figure 5:
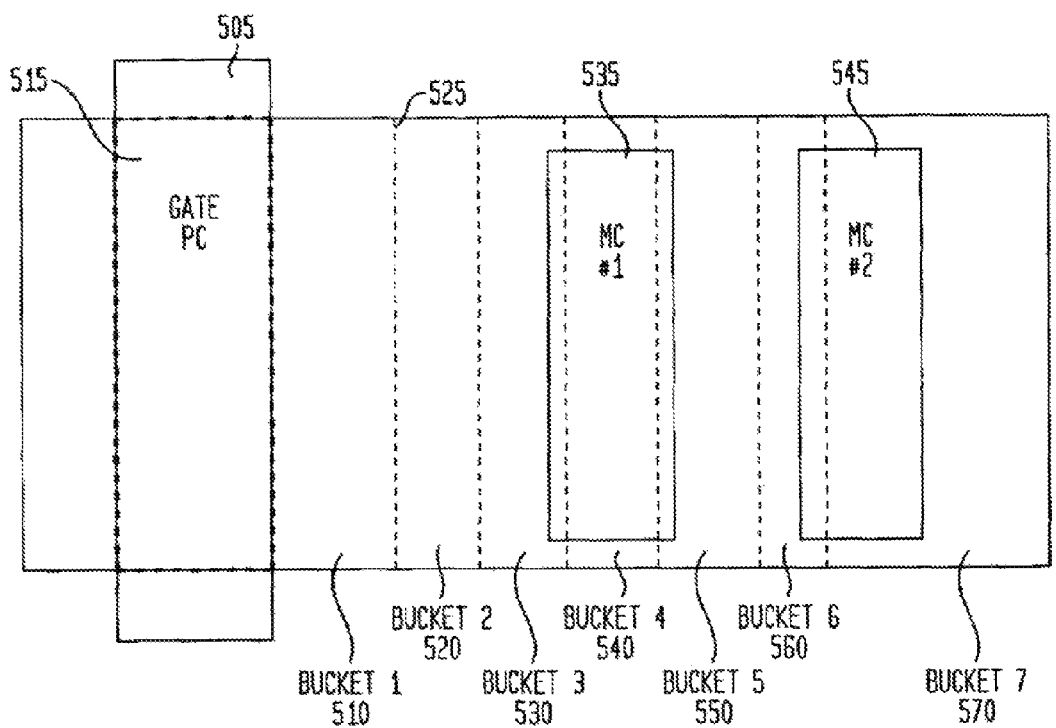
FIG. 5 illustrates an example of gate edge expansion, which is part of the process of forming new buckets, according to an embodiment.

FIG. 5 illustrates an example of gate edge expansion, which is part of the process of forming new buckets, according to the disclosure. An example for one side only of a semiconductor device is provided. In the device 500, a gate PC 505 includes a reference gate/FET area 515, also referred to as a "victim gate". A first metal contact (MC) 535 is the first nearest neighbor to the reference gate/FET area 515, while a second metal contact (MC) 545 is the second nearest neighbor. Starting from a reference point, e.g., the right most edge of the gate PC 505, a number of expansion buckets are provided as bucket 1 (510), bucket 2 (520), bucket 3 (530), bucket 4 (540), bucket 5 (550), bucket 6 (560), and bucket 7 (570). A dashed line 525 represents the areal intersection of PC and RX expanded by integral amounts in the east, or rightward, direction. When a bucket is expanded, at least one edge that is parallel to the reference edge is moving. For purposes of description, the edge closest to the gate is the reference edge, and the other two edges are fixed by the RX edges that run in the direction of the current flow. Thus, the area enclosed by a bucket counts out from the edge of the reference gate. If a bucket only covers part of a shape (e.g., MC), then only that part is reported in that bucket. Subsequent buckets will capture more of the shape until it is entirely enclosed, assuming it all resides within that last bucket searched. The bucket/size locations are chosen such that if a portion of a new shape is found in the last bucket, this distant fragment can be treated in an approximate manner because of its relatively large distance from the victim gate. As will be described, the compact model is able to reconstruct the shape. One constraint is that the bucket spacing be narrower than the minimum extension of a shape in the current-flow direction and the shape-shape spacing should be larger than bucket width. In this way no bucket contains parts of two different shapes (e.g., different taken in the direction of bucket expansion, not "vertically").

Thus, as is seen in FIG. 5, the use of expansion buckets aids in the determination of location information for the MC structures 535, 545. By knowing the size of each bucket and their expansion in the particular direction (longitudinal or transverse), the position of the MC edges (or PC edges) relative to the reference edge of the victim gate are determinable. From this information, referring back to FIG. 4A, the area, perimeter and vertices of shapes enclosed in each bucket is determined as indicated at step 413. Then, at steps 417, 420, further processing is performed including repeating those process steps for expanding buckets in the left and right directions for subsequent PC/MC and recording the area, perimeter and vertices of shapes enclosed in each bucket. Finally, as indicated at step 425, the process steps are repeated for the next FET gate of the circuit to be modeled.

Figure 4B:
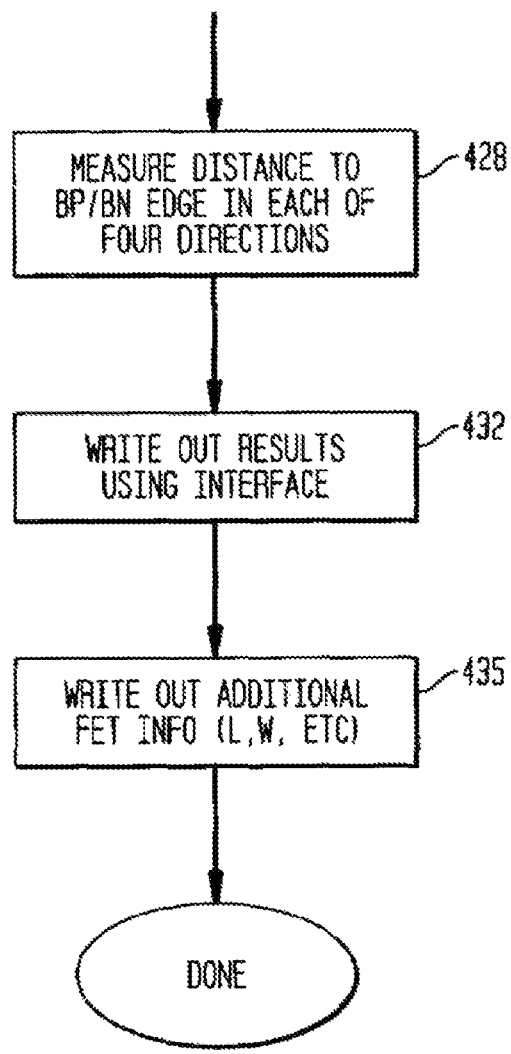
Figure 6:
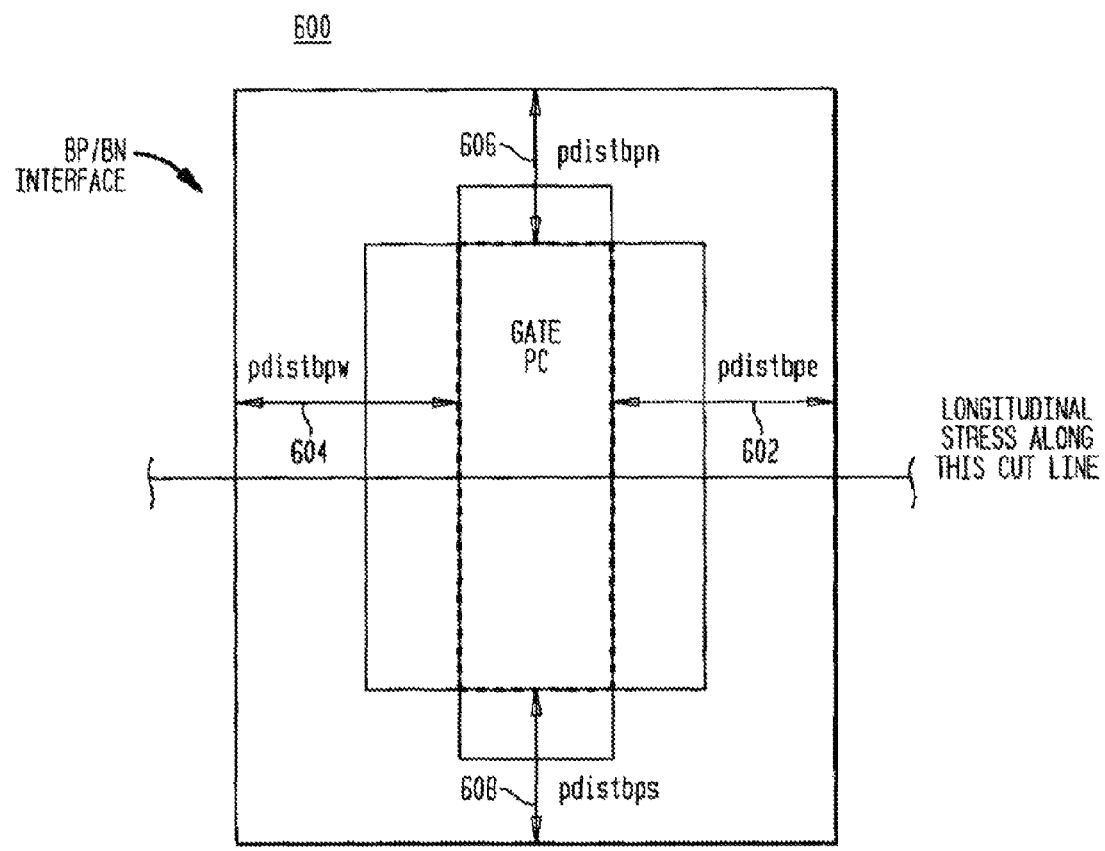
FIG. 6 depicts the BP/BN interface and distances measured to respective BP/BN interfaces from edges defining the gate/FET area according to an embodiment.

Continuing in FIG. 4B, there is shown the further step 428 comprising steps of measuring the distance to BP/BN edge in each of four (4) compass directions. As shown in FIG. 6, the distance measured includes the distance from the PC gate edges to the interface of the adjacent BP/BN edge (local/distant shape edge measurement). Particularly, FIG. 6 illustrates an example of BN/BP edge detection according to the disclosure, for the floating-body case (no body tie). The features of this step include direct measurement of the gate edge to adjacent BP/BN interface including distances that are: i) perpendicular to the current flow direction, ii) parallel to the current flow direction, iii) four measurements, and iv) with respect to gate area. As shown in FIG. 6, the four measurements include distances such as: pdistbpe 602, pdistbpw 604, pdistbpn 606 and pdistbps 608 all measured from edges defining the gate/FET area 515 to the BN/BP edge interface. It is understood that this example assumes BP and BN are always complementary.

Referring back to FIG. 4B, the next step 432 is to write out the results to an interface that provides the annotated netlist with extracted area and perimeters to the compact modeling program 340 (FIG. 3A). A first group of additional extractor parameters that the extractor returns from the bucket expansions (PC/MC) that are generated according to the first phase of the algorithm include: p(u)(v)(w)(x)=value(area or perimeter in microns) where p(u)(v)(w)(x) is a fixed string that is part of an interface that conveys extracted layout information between the extractor and the compact model: u is a variable having one of four values: n=north, s=south, e=east, w=west; v is a variable having one of three values: a=area, p=perimeter and v=vertice count; w is a variable having one of two values: PC is a flag indicating PC shape, and CT is a flag indicating MC shape; and x represents the bucket number. A second group of additional extractor parameters that the extractor returns as part of the interface from the bucket expansions (BP/BN edge) generated according to the first phase of the algorithm are as follows: pdistbp(u)=value(scaled distance in microns), where pdistbp(u) is a fixed string; and u is a variable indicating one or four values: n=north, s=south, e=east, w=west.

It is understood that the traditional extracted information such as the length and width of the poly gate, etc., are also provided to the interface as indicated at step 435.

Figure 7:
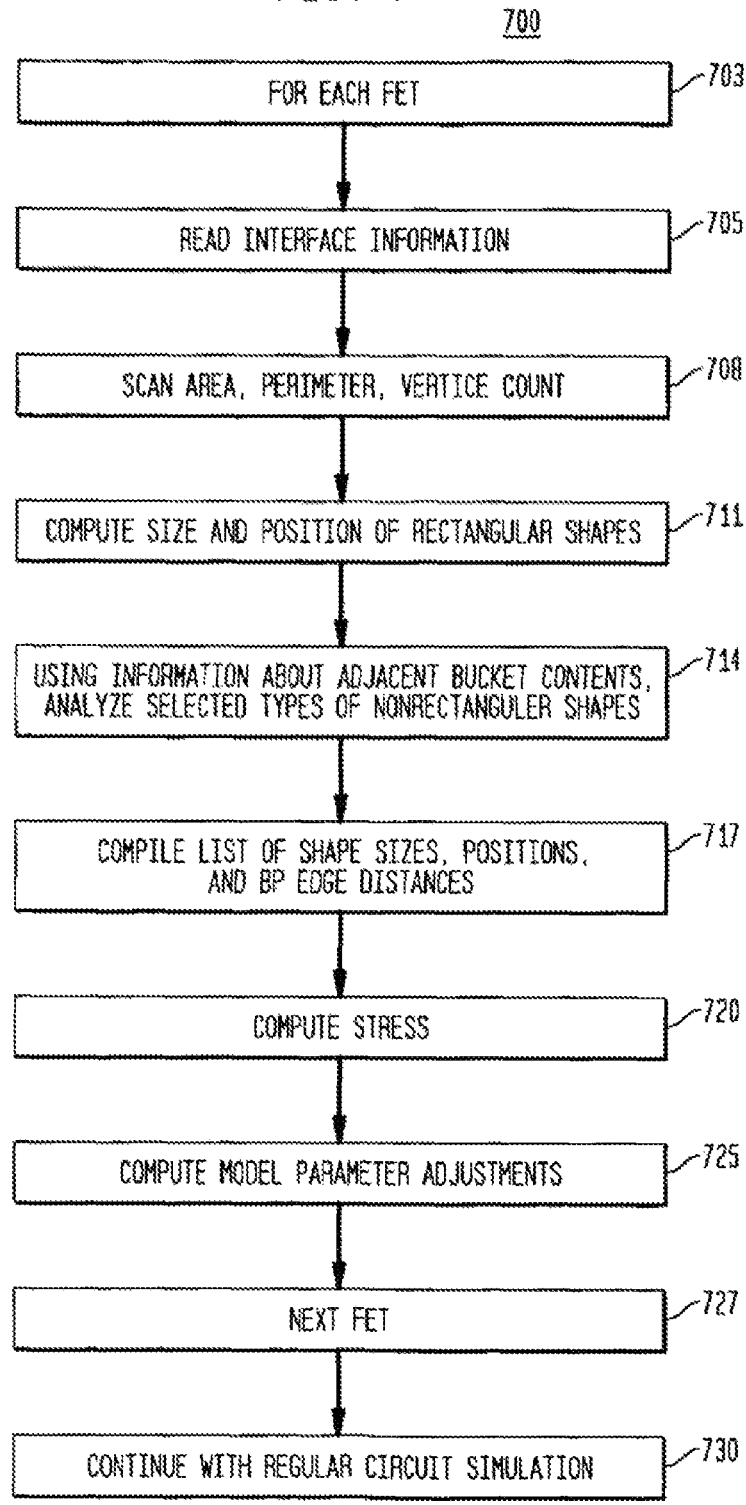
FIG. 7 illustrates the methodology implemented by the compact model program shown in FIG. 3A according to an embodiment.

Referring now to FIG. 7, there is a flow chart depicting the methodology 700 used in compact model/circuit simulation according to the disclosure as performed by the compact modeling program 340 as shown in FIG. 3A. A first step 703 indicates that the subsequent processing steps to be performed pertain to each FET to be modeled. As next shown in FIG. 7, step 705, there is depicted the step of reading the annotated netlist interface information provided by the extraction program. The next step 708 involves scanning the relevant netlist information including the new parameters representing the area, perimeter, vertice count for each of the included features of the semiconductor FET device. From the scanned annotated netlist information obtained at step 708, the next step 711 involves computing the size and position of the rectangular (feature) shapes in the device. Using the information about adjacent bucket contents, selected types of non-rectangular shapes may be further analyzed such as shown at step 714. Then, a list of shape sizes, positions, and BP/BN interface distances is compiled as indicated at step 717. Further, the values of the actual shape dimensions are computed in the compact model from the information passed through the extractor-compact model interface and derived by the extraction program. From this information, the stresses as seen by the gate channel are computed as indicated at step 720.

More particularly, the input parameters obtained by the extraction tool that can be used in computing stresses as seen by the gate channel due to the presence of additional adjacent shapes (e.g., MC, PC and BP/BN interface) in the compact model are now described hereinbelow in view of equations (1)-(8).

As the analytical model is designed to reduce the complex 3D geometry to an "average" stress for each device, the impact on the device mobility and other important metrics can be evaluated. In the following equation 1), the stress is assumed to be uniform and is therefore taken as a single, average value. According to equation 1, a total stress "σ" given in megaPascals, for example, is calculated as:

$$\sigma = \sigma^L - \sigma^T \quad (1)$$

where $\sigma^L$ is the liner induced stress in the longitudinal direction (parallel to current flow) and is governed according to equation (2a) as follows:

$$\sigma^L = \sigma_{self} - \sigma_{mc} - \sigma_{pc} - \sigma_{Bp}^L \quad (2a)$$

and, where $\sigma^T$ is the liner induced stress in the transverse direction (perpendicular to current flow) and is governed according to equation (2b) as follows:

$$\sigma^T = \sigma_{Bp}^T + \sigma_{body\ contact} \quad (2b)$$

In accordance with equations (2a) and (2b), the following terms are defined:

$$\sigma_{self} = f_1(L_{poly}\ of\ victim\ gate) \quad (3)$$

where $\sigma_{self}$ represents a nominal self stress term that represents the transistor in isolation where $f_1$ is a polynomial weighting function inversely dependent upon the gate length $L_{poly}$ of the "victim gate" of the FET that is being analyzed;

$$s_{mc} = f_2(d_i, t_{mc}, MC_i, W_{poly}) \quad (4)$$

where $\sigma_{mc}$ represents a stress term contributed by the additional adjacent MC shapes introduced through the summation terms (one for the left side of the gate, the other for the right side); and, $$s_{pc} = f_3(d_i, t_{pc}, PC_i, W_{poly}) \quad (5)$$

where $\sigma_{pc}$ represents a stress term contributed by the PC shapes introduced through the summation terms (one for the left side of the gate, the other for the right side).

The definition of terms for stress equations due to MC and PC shapes include the following:

$d_i$=distance between center of victim gate and center of adjacent shape (See FIG. 2 where $d_i$ is denoted as $d_l$ and $d_r$);

$t_{mc}$=width of MC (in direction of current flow);

$t_{pc}$=width of PC (in direction of current flow);

$MC_i$, $PC_i$=runlength of MC (PC) shape (perpendicular to current flow);

$W_{poly}$=width of victim gate (parallel to current flow); and

It is understood that the details of the nitride film process are reflected in the model since the stiffness coefficients and thickness of the films can be used in the equations.

In the following equations:

$\sigma_{Bp}^L$ represents a stress term contributed by the BP edge effect term in the longitudinal direction due to presence of the liner film;

$\sigma_{Bp}{}^T$ represents a stress term contributed by the BP edge effect term in the transverse direction due to presence of the liner film; and, $\sigma_{body\ contact}$ represents a body contact stress term that is present only if the transistor has an SOI body contact.

Utilizing the BP/BN distance measurements obtained via the extraction tool, the stress $\sigma_{Bp}{}^L$ stress term contributed by the BP edge effect term in the longitudinal direction due to presence of the liner film is computed as:

$$s_{Bp}{}^L = f_5(\text{pdistbpe}, \text{pdistbpw}) \quad (6)$$

Likewise, the $\sigma_{Bp}{}^L$ stress term contributed by the BP edge effect term in the transverse direction due to presence of the liner film is computed as:

$$s_{Bp}{}^T = f_6(\text{pdistbpn}, \text{pdistbps}). \quad (7)$$

The term $\sigma_{body\ contact}$ represents a body contact stress term and is computed as:

$$s_{BC} = f_7(W_{poly}). \quad (8)$$

In further view of FIG. 7, continuing at step 725, there is depicted the step of computing model parameter adjustments based accordingly on the stress values computed at step 720. This step involves computing an adjusted carrier mobility value $\mu_O{}^S$ according to equation (9) as follows:

$$\mu_O{}^S = \mu_O{}^{original}[f_8(\sigma^L, \sigma^T)] \quad (9)$$

where $\mu_O{}^{original}$ the nominal carrier mobility value (calibrated to a reference stress level); and $f_8$ is a polynomial weighting function that is a function of the calculated longitudinal stress $\sigma^L$ and the transverse stress $\sigma^T$. Additional relationships between the computed stress values and other compact model parameters such as threshold or mobility sensitivity to vertical electric field are additionally contemplated.

Finally, as indicated at step 727, the process steps depicted in FIG. 7 are repeated for the next FET in the circuit, and the compact modeling program continues with the regular circuit simulations only now utilizing more accurate modeling that accounts for liner stress-induced factors. Only until the other FET model parameters have been adjusted to account for the stress effects, will the regular circuit simulations commence, as indicated at step 730. In the regular circuit simulations, circuit-level quantities may be computed from the compact model parameters. That is, the compact model code adapted for determining terminal currents and charge is then used to generate terms for use in circuit simulation in a further phase of the algorithm. The compact model code can be a conventional code that is readily available from academia (such as a BSIM model) or a custom code that has been developed for stress modeling.

It should be understood that the methodology of the present invention is capable of handling semiconductor devices having more complex shapes than the common FET device arrangements. FIGS. 8A and 8B illustrate examples of the more complex FET arrangements capable of being analyzed by the methodology of the invention. As shown in FIG. 8A, the method of the invention is enabled to extract additional area, perimeter and vertice parameters (in buckets) used for stress calculations for a "T-style" body contact FET device 810, and an "H-style" body contact FET device 850. The T-style body contact FET device layout 810 shown in FIG. 8A includes the PC (gate) 813, MC drain and source contacts 815, RX (diffusion) 820, MC (body contact) 825 and BP edge 830 portions, while an H-style body contact FET device layout 850 shown in FIG. 8B includes the PC (gate) 853, MC drain and source contacts 815, RX (diffusion) 820, MC (body contact) regions 875a, 875b portions including respective BP edges 880a, 880b. All sizes of these features sizes can be fixed by ground rules that allow the additional stress contribution to be modeled using equations such as equation (8).

According to a further aspect of the present invention, there is provided a computer-implemented system and method for optimizing design of semiconductor devices such as a semiconductor transistor device, that is designed with to have one or more liner films providing transistor stress. The ability to model liner film stress effects gives circuit designers the ability to optimize their circuits for stress effects.

In general, the presence of adjacent shapes can degrade the stress seen by the victim gate and therefore reduces performance. An example is a local interconnect (MC) shape adjacent to the victim gate. Generally the stress decreases as the MC shape is positioned closer to the victim gate. The stress increases as the MC strapping factor is decreased because of the smaller interruption of the liner film. However these changes affect other aspects of the electrical response of the transistor. For example, moving the MC shape closer to the gate increases capacitive coupling with the gate, which is generally a negative factor, and reducing the strapping factor increases the effective series resistance of the transistor, which is also a negative factor. Other factors such as adjacent PC wiring/gates can also influence the stress response. For example, close PC gates tends to improve performance but reduce stress. Adjacent PC wiring may reduce wiring resistance but also reduce stress. Therefore, since there are design tradeoffs between stress and other circuit electrical factors, it is desirable to use the stress-enabled compact model to optimize the circuit response.

Figure 9:
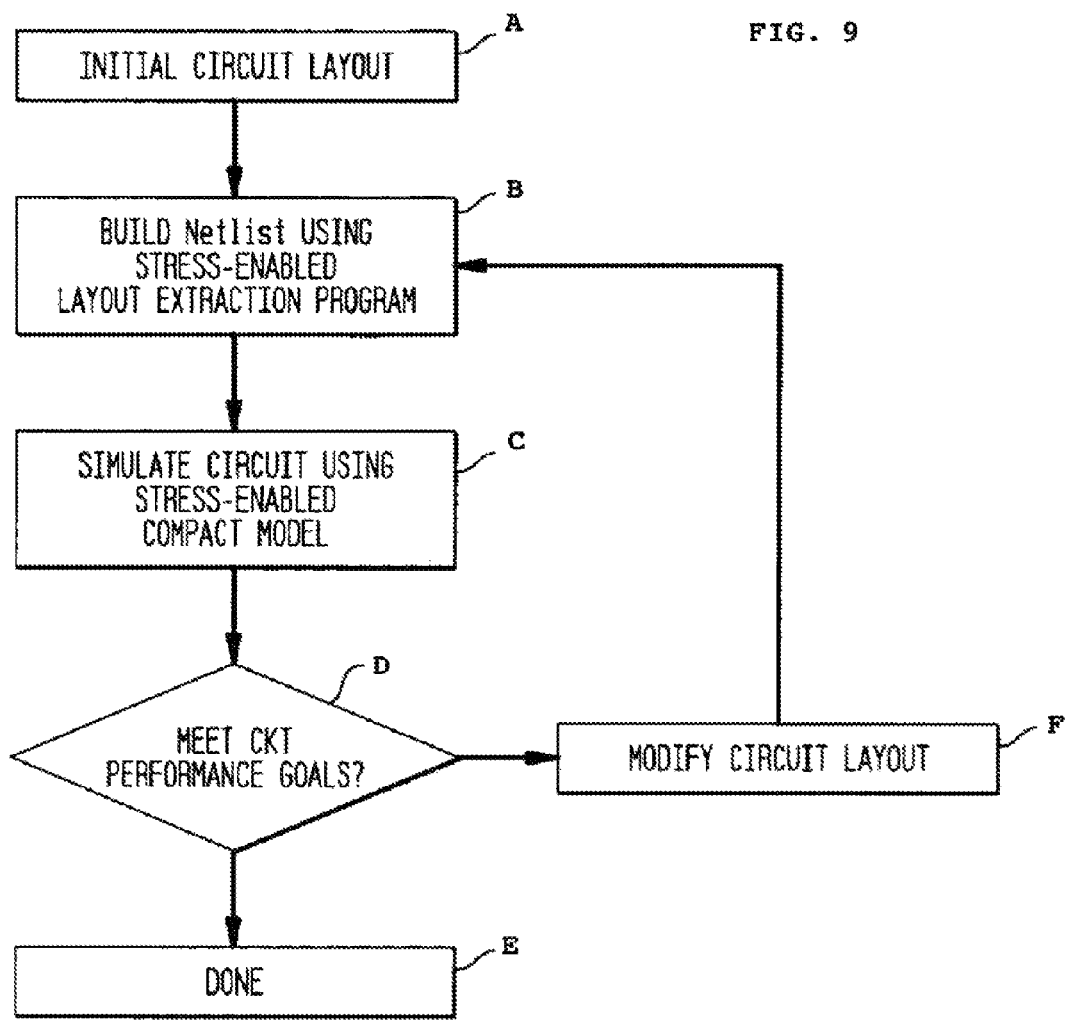
FIG. 9 is a flowchart depicting a method for using the stress-enabled compact model to optimize circuit designs according to an embodiment.

FIG. 9 is a flowchart depicting a process for using the stress-enabled compact model to optimize circuit designs. The process includes an iterative loop between circuit layout, extraction, the compact model, and circuit simulation. The optimization could either be manually performed or driven by an optimization program that uses techniques such as a Newton hill-climbing approach or a genetic algorithm approach or other methods. Circuit layout modifications can be done manually or using an automated program. As shown in a block A, there is depicted the step of providing the initial circuit layout, including, for example, reading in graphical layout data of devices in the circuit. Then, at block B, a netlist is built using the stress-enabled layout extraction program as described herein with respect to FIGS. 4-7.

Continuing next to block C, there is depicted the step of simulating the designed circuit using the stress-enabled compact model. Block D involves determining whether the circuit performance goals have been achieved for that particular design. If the performance goals have been met, then the process terminates at block E; otherwise, if the designed circuit did not meet those performance goals, the circuit design may be modified as indicated at block F and the process returns to block B in order to build a new netlist using the stress-enabled layout extractor program.

As detailed above, current large-scale integration technologies often use a mask engineering process called "mask comps" (compensation of layout shape dimensions). Such comps are used, for example, to locally adjust FET channel length to control Ioff and Ieff in different threshold families on the same wafer to help set power/performance points. Mask comps can result in FET gates on a wafer with different on-wafer channel lengths that are adjacent to each other.

Although the above-described methodology has been effectively used to model physical layouts and analyze the stress response of large-scale integration technologies without comps, and can be used to treat some types of layouts with comps, there are some types of layout configurations that are less accurately treated than is desirable. This occurs, in part, because the use of comps often results in shapes that have many corners that are difficult to detect and analyze.

Figure 10:
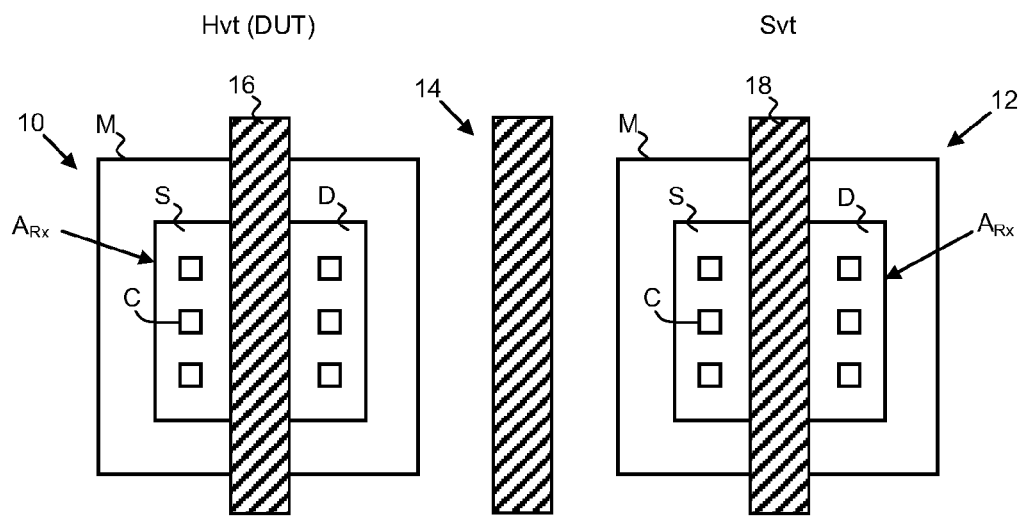
FIG. 10 depicts an illustrative layout before polysilicon comp according to an embodiment.

An illustrative layout before polysilicon comp is depicted in FIG. 10. In this example, the layout includes a high threshold (Hvt) FET 10, a super-high threshold (Svt) FET 12, and a dummy shape 14 used for ACLV (across chip line-width variation) control. In this example, the high threshold FET 10 is considered to be the device under test (DUT). Similar to the device shown in FIG. 1, each of the FETS 10, 12 includes a polysilicon (PC) gate 16, 18, respectively, an active area $A_{RX}$ including source S and drain D regions, and a plurality of contacts C, all formed over an oxide region. Each of the FETS 10, 12 further includes a respective implant mask M to set the corresponding threshold voltage.

Figure 11:
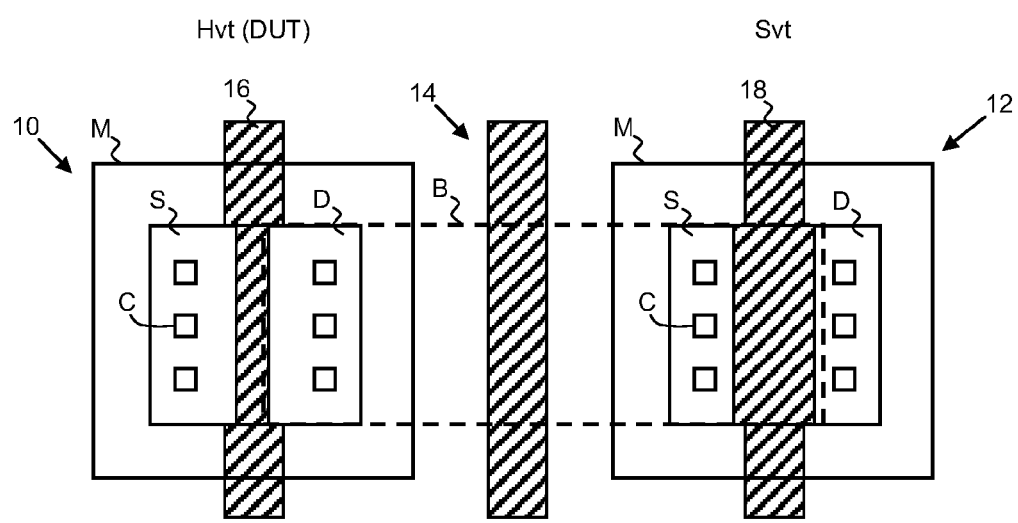
FIG. 11 depicts the layout of FIG. 10 after polysilicon comp according to an embodiment.

An example of the layout of FIG. 10 after a polysilicon comp is applied is depicted in FIG. 11. In this case, the FET 10 sees a negative gate length comp within its active area $A_{RX}$, while the FET 12 sees a positive comp within its active area $A_{RX}$. When modeled from left to right in the layout of FIG. 11 using the above-described bucket approach, the shapes are exactly resolved since only rectangular gate shapes are enclosed within the bucket B. This is a simplistic example of a layout which illustrates how some types of layouts with comps can be analyzed using the above-described bucket approach.

Figure 12:
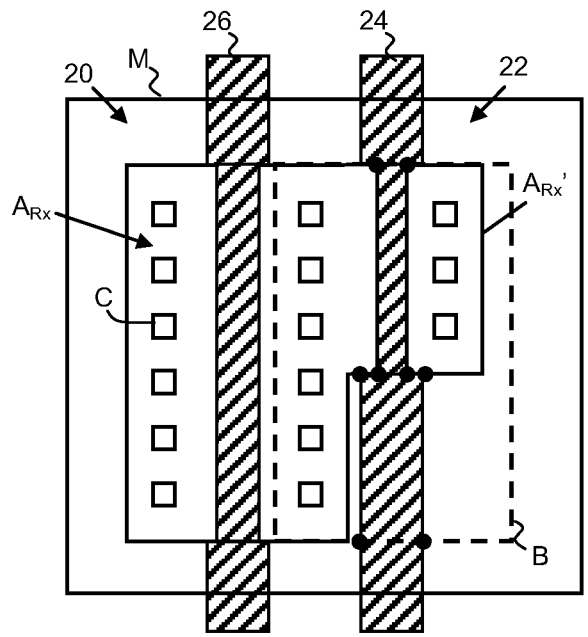
FIGS. 12 and 13 depict additional layouts after polysilicon comp according to an embodiment.

A first, more complex example of a layout after a polysilicon comp is applied, which illustrates the deficiencies of the above-described bucket approach, is depicted in FIG. 12. In this example, the layout includes a FET 20 under test and a neighboring FET 22. As shown, both FETS 20, 22, have different negative gate length comps, and the FET 22 has an active area $A_{RX}{}'$ that is smaller than the active area $A_{px}$ of the FET 20. Because of the smaller active area $A_{RX}{}'$, the PC gate 24 of the FET 22 extends over a smaller area of the underlying diffusion region than the PC gate 26 of the FET 20. This creates a plurality of gate corners and vertices, hereafter collectively referred to as "vertices," in the bucket B. The plurality of vertices (8 in this example) are indicated by solid circles (●) in the layout in FIG. 12. To this extent, due to the plurality of gate vertices, the bucket B sees a plurality of shapes of varying widths, which results in an undesirable approximation of shapes during modeling for stress analysis.

Figure 13:
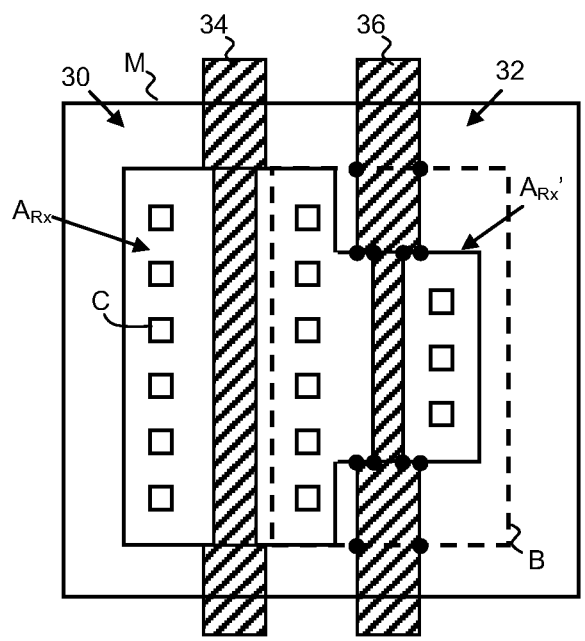

Another example of a layout after a polysilicon comp is applied is depicted in FIG. 13. In this example, the layout includes a FET 30 under test and a neighboring FET 32. The PC gates 34, 36 of the FETS 30, 32 both have a negative gate length comp. In this example, due to the relative sizes and positions of the active areas $A_{RX}$ and $A_{RX}{}'$ of the FETS 30, 32, respectively, a plurality of vertices (12 in this example) are present in the bucket B. To this extent, due to the plurality of vertices, the bucket B sees a plurality of shapes of varying widths, which results in an undesirable approximation of the shapes during modeling for stress analysis.

The following portion of the disclosure describes a method for more accurately modeling and analyzing the stress response of layout configurations that include comps. The bucket approach of the present invention adds to the above-described bucket approach by introducing a PC pattern template that is derived from layout groundrules, including, for example, the size (e.g., area) of PC shapes, the relative location or spacing of PC shapes (e.g., pitch), the level location of the PC shapes, and optionally, the configuration (e.g., vertices, corners) of PC shapes. The PC pattern template is used to help identify comped PC gates adjacent to a FET being analyzed to facilitate accurate layout and stress analysis (e.g., using the above-described stress analysis or other suitable stress analysis techniques).

According to an embodiment employing the bucket approach of the present invention, a PC pattern template can be used to help and more accurately identify adjacent PC shapes with or without comp, by looking for bucket contents that satisfy the following rules, each of which will be described in greater detail below:

(1) The area of the PC shape within the bucket falls within expected minimum and maximum rectangular areas;

(2) The location of the PC shape follows a predetermined pattern (e.g., an expected pitch) of an adjacent PC shape; and (3) The area of a shape (e.g., the PC shape) is on a predetermined level (e.g., the PC level).

An optional rule (4), namely that the vertices count of the PC shape within the bucket is greater than or equal to 8, can be used in addition to the above rules to help identify adjacent PC shapes in layout configurations with or without comp.

It is noted that different sets/combinations of these template rules may be included in any given PC pattern template, and that not all of these template rules necessarily need to be satisfied to identify adjacent PC shapes.

Figure 14:
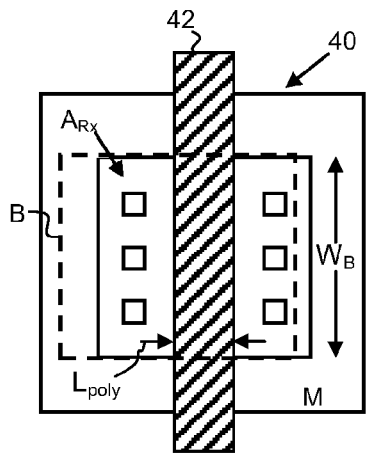
FIGS. 14-16 depict illustrative minimum and maximum areas of a polysilicon shape according to an embodiment.
Figure 15:
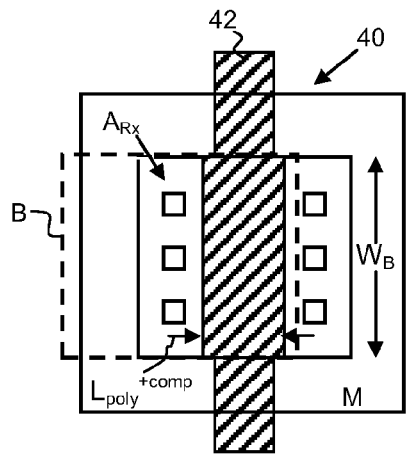
Figure 16:
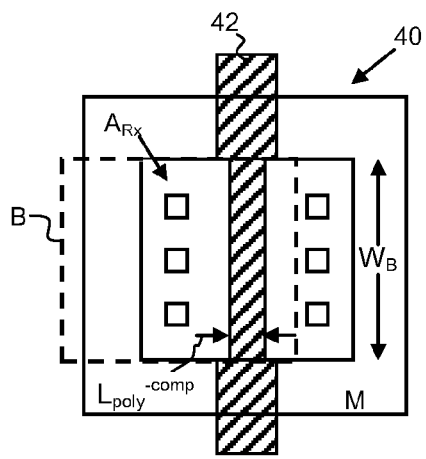

The first rule, which states that that the area of the PC shape within a bucket B falls within expected minimum and maximum rectangular areas, will be better understood with reference to the illustrative layouts depicted in FIGS. 14-16.

As shown in FIG. 14, no comp has been applied to the PC gate 42 of a FET 40 in an active area $A_{RX}$. To this extent, in this example, the rectangular area $A_{no\text{-}comp}$ of the PC shape (i.e., PC gate 42) within the bucket B (also referred to herein as a bucket structure B) is given by the length ($L_{poly}$) (measured in the current flow direction) of the PC gate 42 multiplied by the width ($W_B$) of the bucket B.

Referring now to FIG. 15, a positive comp has been applied to the PC gate 42 of the FET 40. In this case, the rectangular area $A_{+comp}$ of the PC shape (i.e., PC gate 42) within the bucket B is given by ($L_{poly}{}^{+comp} \times W_B$), where $A_{no\text{-}comp} < A_{+comp}$. Analogously, referring to FIG. 16, a negative comp has been applied to the PC gate 42 of the FET 40. In this case, the rectangular area $A_{-comp}$ of the PC shape (i.e., PC gate 42) within the bucket B is given by ($L_{poly}{}^{-comp} \times W_B$), wherein $A_{-comp} < A_{no\text{-}comp} < A_{+comp}$. Thus, for a PC shape (with or without comp) to be identified within the bucket B, it should have an area that falls within the minimum and maximum rectangular areas given by $A_{-comp}$ and $A_{+comp}$, which are indicative of negative and positive comps, respectively.

The second rule states that the location of the PC shape follows a predetermined pattern (e.g., an expected pitch) of an adjacent PC shape. This rule is described with reference to FIG. 17.

Figure 17:
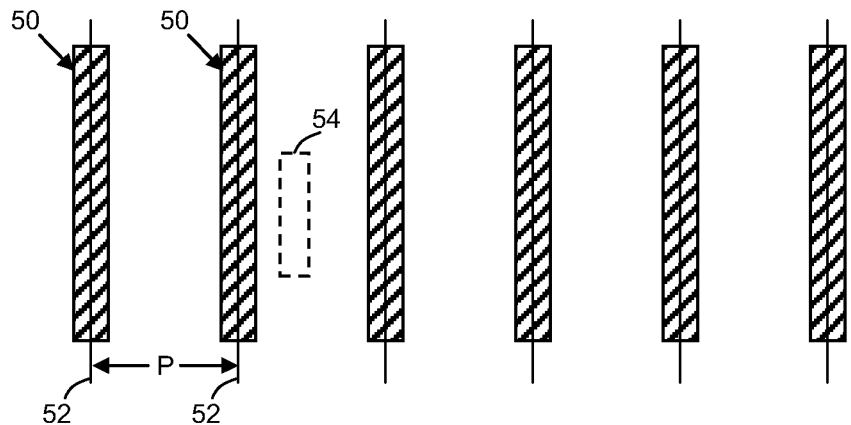
FIG. 17 depicts an illustrative layout of polysilicon gates formed in a predetermined pattern.

FIG. 17 depicts an illustrative arrangement of PC gates 50 in a device. Generally, such PC gates 50 are formed a uniform distance apart (i.e., on pitch) due to ultra-narrow gate lithographic printing requirements. That is, if a pitch line 52 is drawn down the center of each PC gate 50, the pitch lines 52 would be the same distance (P) apart from one another. Thus, if a PC shape is present within the bucket B at a location corresponding to (e.g., straddling) a predetermined pattern feature (e.g., an expected pitch line), then the PC shape is more than likely a PC gate. Contrastingly, if a PC shape, such as the PC shape 54 shown in phantom (dotted line) in FIG. 17, is present within the bucket B at a location that falls between two pitch lines, then the PC shape 54 is probably not a PC gate.

The third rule states that the area of a shape is on a predetermined level. In an embodiment of the present patent application, the shape is a PC shape and the predetermined level is the PC level of the layout. This rule is provided to ensure that the bucket B does not look at PC shapes within any level other than the PC level when analyzing a layout. This rule can be expanded to apply to other shapes/layers within a layout.

The optional fourth rule, which states that the vertices count of the PC shape within the bucket is greater than or equal to 8, can be used in addition to the above rules to help identify adjacent PC shapes in layout configurations with or without comp. Illustrative examples of the application of this rule are depicted in FIGS. 12, 13, 20, and 21.

Figure 20:
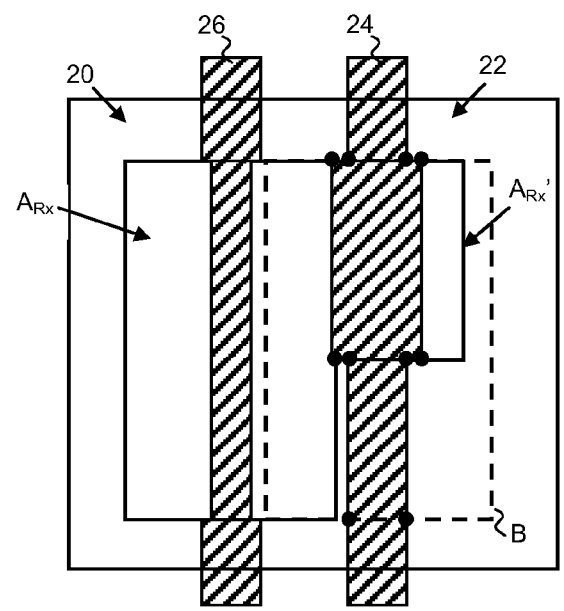
FIGS. 20 and 21 depict additional layouts after polysilicon comp according to an embodiment.
Figure 21:
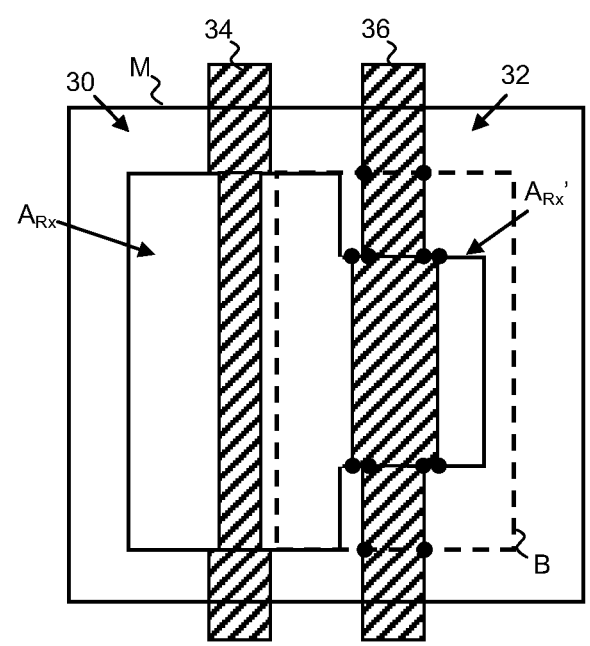

As described above, in the negative gate length comp layouts depicted in FIGS. 12 and 13, there are 8 and 12 vertices, respectively, within the bucket B. In similar positive gate length comp layouts, there are at least 8 vertices within the bucket B, as shown in FIGS. 20 and 21, respectively. In each case, there are 8 or more vertices present in the bucket B. By determining the vertices count, the present invention provides a better approximation of the shapes within the bucket B during modeling for stress analysis.

By applying a set of the rules of the PC pattern template to the contents of a bucket B, the bucket approach of the present invention provides a mechanism by which layout configurations, with or without comp, can be more accurately modeled for stress analysis. An illustrative example is depicted in FIG. 18.

Figure 18:
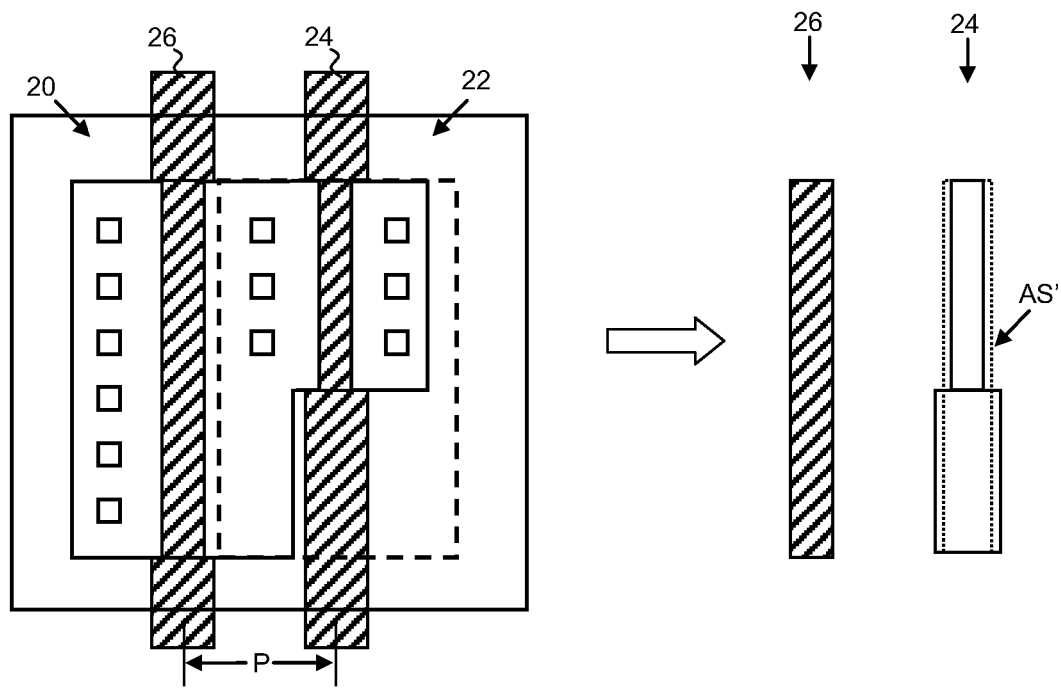
FIGS. 18 and 19 depict examples of the application of a PC pattern template to the contents of a bucket according to an embodiment.

The left portion of FIG. 18 depicts the layout previously described with reference to FIG. 12. When applying the PC pattern template of the bucket approach of the present invention to the contents of the bucket B, the rules of the PC pattern template are satisfied as follows:

(1) The PC shape (i.e., the PC gate 24) within the bucket B has an area that is within an expected minimum and maximum rectangular area—Yes;

(2) The location of the PC shape follows a predetermined pattern (e.g., an expected pitch P) of an adjacent PC shape—Yes; and (3) The area of the PC shape is on a PC level—Yes.

Optional rule (4), namely that the vertices count of the PC shape within the bucket B is greater than or equal to 8, is also satisfied, since there are 10 vertices within the bucket B. A vertices count of the PC shape within the bucket B that is greater than or equal to 8 can provide, for example, an indication that a positive or negative comp has been applied to the PC shape.

Based on these results, the PC gate 24 of the FET 22 located within the bucket B can be mapped to a rectangular area having an approximated shape (AS') (indicated in phantom in FIG. 18). In accordance with an embodiment, an algorithm for generating an approximated shape AS' comprises taking the area within the bucket B that matched the template and make the width of the approximated shape AS' equal to the width $W_B$ of the bucket B. The length of the approximated shape AS' is set to the matching area within the bucket B divided by the width $W_B$ of the bucket B.

Figure 19:
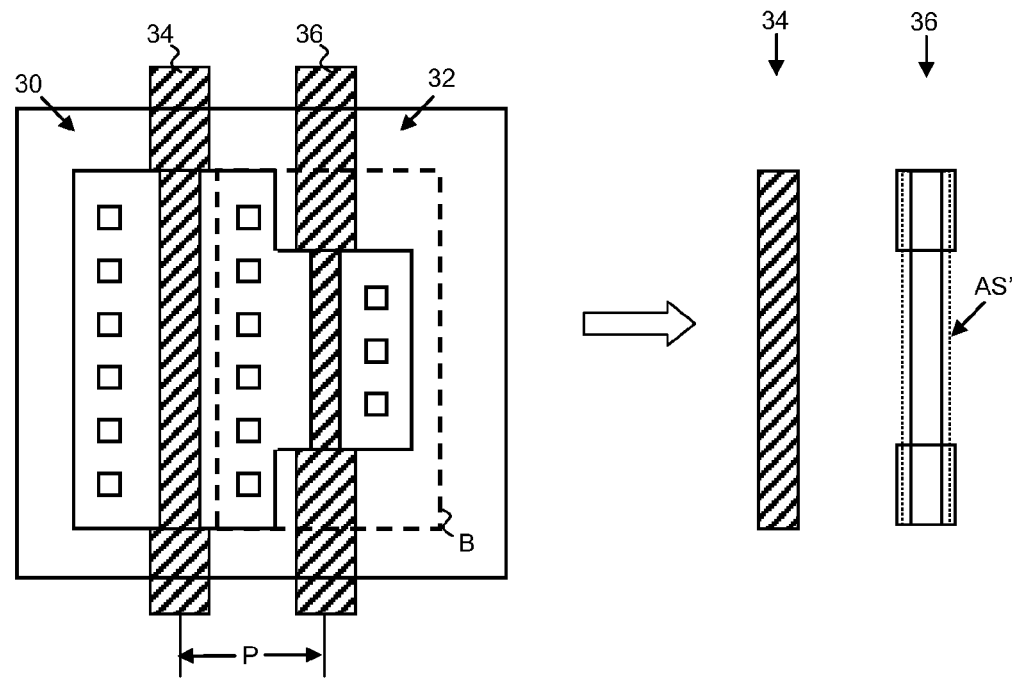

Another illustrative example of the application of a set of the rules of the PC pattern template to the contents of a bucket B is depicted in FIG. 19.

The left portion of FIG. 19 depicts the layout previously described with reference to FIG. 13. When applying the PC pattern template of the bucket approach of the present invention to the contents of the bucket B, the rules of the PC pattern template are satisfied as follows:

(1) The PC shape (i.e., the PC gate 36) within the bucket B has an area that is within an expected minimum and maximum rectangular area—Yes;

(2) The location of the PC shape follows a predetermined pattern (e.g., an expected pitch P) of an adjacent PC shape—Yes; and (3) The area of the PC shape is on a PC level—Yes.

Optional rule (4), namely that the vertices count of the PC shape within the bucket B is greater than or equal to 8, is also satisfied, since there are 12 vertices within the bucket B. A vertices count of the PC shape within the bucket B that is greater than or equal to 8 can provide, for example, an indication that a positive or negative comp has been applied to the PC shape.

Based on these results, the PC gate 36 of the FET 32 located within the bucket B is again mapped to a rectangular area having an approximated shape (AS') that closely represents the actual shape of the PC gate 36.

Comparing the left and right portions of FIGS. 18 and 19, it can be seen that the approximated shape (AS') determined using the bucket approach of the present invention (i.e., using a PC pattern template) closely matches the original configuration of the original PC shape. This allows for a much more accurate modeling and analysis of the stress response of the layout.

The present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module" or "system." Furthermore, aspects of the present disclosure may take the form of a computer program product embodied in any tangible medium of expression having computer readable program code embodied in the medium.

Any combination of one or more computer readable medium(s) may be utilized. The computer readable medium may be a computer readable storage medium or a computer readable signal medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this disclosure, a computer readable storage medium may be any tangible medium that can contain or store a program for use by or in conjunction with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments taught herein. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer or other programmable data processing apparatus to function in a particular manner, such that the instructions stored in the computer readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The foregoing flowchart and block diagram drawings in the Figures illustrate the architecture, functionality, and operation of possible implementations of systems, methods and computer program products according to various several embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. Also, one of ordinary skill in the art will recognize that additional blocks that describe the processing may be added. The terminology used herein is for the purpose of describing particular embodiments only and is not intended to be limiting of the disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The invention claimed is:

1. A method for layout analysis, comprising:
analyzing, using at least one computing device, a semiconductor layout using a bucket structure, the layout including a semiconductor device;
applying a pattern template to the bucket structure; and
identifying a shape adjacent to the semiconductor device, in response to a plurality of rules included in the pattern template, wherein the plurality of rules includes:
determining whether an area of the adjacent shape within the bucket structure falls within predetermined minimum and maximum areas;
determining whether a location of the adjacent shape follows a predetermined pattern; and
determining whether an area of the adjacent shape is located on a predetermined level of the layout.

2. The method of claim 1, further comprising:
computing stress effects for circuit simulation based on the identified adjacent shape.

3. The method of claim 1, wherein the adjacent shape comprises:
a transistor including a gate having a compensated gate length.

4. The method of claim 1, wherein the adjacent shape comprises:
a transistor including a gate having a compensated gate length, and wherein the predetermined minimum and maximum areas are indicative of a negative or positive compensation of the gate length, respectively.

5. The method of claim 1, wherein the plurality of rules further includes:
determining whether a number of vertices of the adjacent shape within the bucket structure is greater than or equal to 8.

6. A system for layout analysis, comprising:
using at least one computing device for performing a method, the method comprising:

analyzing a semiconductor layout using a bucket structure, the layout including a semiconductor device;

applying a pattern template to the bucket structure; and identifying a shape adjacent to the semiconductor device, in response to a plurality of rules included in the pattern template, wherein the plurality of rules includes:

determining whether an area of the adjacent shape within the bucket structure falls within predetermined minimum and maximum areas;

determining whether a location of the adjacent shape follows a predetermined pattern; and determining whether an area of the adjacent shape is located on a predetermined level of the layout.

7. The system of claim 6, wherein the method further comprises:

computing stress effects for circuit simulation based on the identified adjacent shape.

8. The system of claim 6, wherein the adjacent shape comprises a transistor including a gate having a compensated gate length.

9. The system of claim 6, wherein the plurality of rules further includes:

determining whether a number of vertices of the adjacent shape within the bucket structure is greater or equal to 8.

10. A computer program comprising program code embodied in at least one non-transient computer readable storage medium, which when executed, enables a computer system to implement a method for layout analysis, the method comprising:

analyzing a semiconductor layout using a bucket structure, the layout including a semiconductor device;

applying a pattern template to the bucket structure; and identifying a shape adjacent to the semiconductor device, in response to a plurality of rules included in the pattern template, wherein the plurality of rules includes:

determining whether an area of the adjacent shape within the bucket structure falls within predetermined minimum and maximum areas;

determining whether a location of the adjacent shape follows a predetermined pattern;

determining whether an area of the adjacent shape is located on a predetermined level of the layout; and computing stress effects for circuit simulation based on the identified adjacent shape.

11. The computer program of claim 10, wherein the adjacent shape comprises a transistor including a gate having a compensated gate length.

12. The computer program of claim 10, wherein the plurality of rules further includes:

determining whether a number of vertices of the adjacent shape within the bucket structure is greater or equal to 8.

* * * * *